United States Patent

Yang et al.

(10) Patent No.: US 9,321,368 B2
(45) Date of Patent: Apr. 26, 2016

(54) MULTI-STEP MODEL PREDICTIVE ITERATIVE TECHNIQUES FOR BATTERY SYSTEM PEAK POWER ESTIMATION

(71) Applicants: Hong Yang, Rochester Hills, MI (US); Pawel Malysz, Hamilton (CA); Jin Ye, Hamilton (CA); Ran Gu, Hamilton (CA); Ali Emadi, Burlington (CA)

(72) Inventors: Hong Yang, Rochester Hills, MI (US); Pawel Malysz, Hamilton (CA); Jin Ye, Hamilton (CA); Ran Gu, Hamilton (CA); Ali Emadi, Burlington (CA)

(73) Assignees: FCA US LLC, Auburn Hills, MI (US); McMaster University, Ontario (CA)

( * ) Notice: Subject to any disclaimer, the term of this patent is extended or adjusted under 35 U.S.C. 154(b) by 3 days.

(21) Appl. No.: 14/463,027

(22) Filed: Aug. 19, 2014

(65) Prior Publication Data

US 2016/0052418 A1 Feb. 25, 2016

(51) Int. Cl.
| | |
|---|---|
| *B60L 11/18* | (2006.01) |
| *G01R 31/36* | (2006.01) |
| *G05B 13/04* | (2006.01) |
| *B60L 15/20* | (2006.01) |

(52) U.S. Cl.
CPC ......... *B60L 11/1861* (2013.01); *B60L 15/2045* (2013.01); *G01R 31/3624* (2013.01); *G01R 31/3662* (2013.01); *G01R 31/3675* (2013.01); *G01R 31/3693* (2013.01); *G05B 13/048* (2013.01); *Y10S 903/93* (2013.01)

(58) Field of Classification Search
CPC .............. H02J 7/00; G06F 1/28; G06F 19/00; G01R 31/36; G01R 31/3693; G01R 31/3624; G01R 31/3662; G01R 31/3675; G01N 27/416; B60K 6/46; H01M 10/46; B60L 11/1861; B60L 15/2045; G05B 13/048
See application file for complete search history.

(56) References Cited

U.S. PATENT DOCUMENTS

| | | | |
|---|---|---|---|
| 5,274,827 A * | 12/1993 | Haggerty | G06F 1/30 365/226 |
| 7,109,685 B2 | 9/2006 | Tate, Jr. et al. | |
| 7,250,741 B2 * | 7/2007 | Koo | G01R 31/3624 320/132 |
| 7,321,220 B2 | 1/2008 | Plett | |
| 7,518,339 B2 | 4/2009 | Schoch | |
| 7,656,122 B2 | 2/2010 | Plett | |
| 7,969,120 B2 | 6/2011 | Plett | |
| 2004/0220758 A1* | 11/2004 | Barsoukov | G01R 31/361 702/63 |
| 2006/0091863 A1* | 5/2006 | Melichar | G01R 31/361 320/132 |
| 2010/0019731 A1* | 1/2010 | Connolly | H02J 1/14 320/136 |
| 2011/0174561 A1* | 7/2011 | Bowman | B60K 6/46 180/65.245 |
| 2011/0309838 A1* | 12/2011 | Lin | G01R 31/3624 324/427 |
| 2014/0079969 A1* | 3/2014 | Greening | H01M 10/48 429/91 |

* cited by examiner

*Primary Examiner* — Mussa A Shaawat
*Assistant Examiner* — Kelly D Williams
(74) *Attorney, Agent, or Firm* — Ralph E. Smith

(57) ABSTRACT

An electrified vehicle and method for estimating peak power of a battery system of the electrified vehicle are presented. In one exemplary implementation, the method includes receiving, at a controller of the electrified vehicle, measured current, voltage, and temperature of the battery system and determining, at the controller, operating parameters for the battery system based on the measured current, voltage, and temperature. An initial peak current at a start of a current prediction period for the battery system is determined, at the controller, based on the operating parameters, and an instantaneous peak current of the battery system is determined based on its initial peak current by performing voltage-limited extrapolation of resistances and open-circuit voltage (VLERO) of a battery model for the battery system. The battery system and an electric motor of the electrified vehicle are controlled, by the controller, based on the instantaneous peak current.

15 Claims, 4 Drawing Sheets

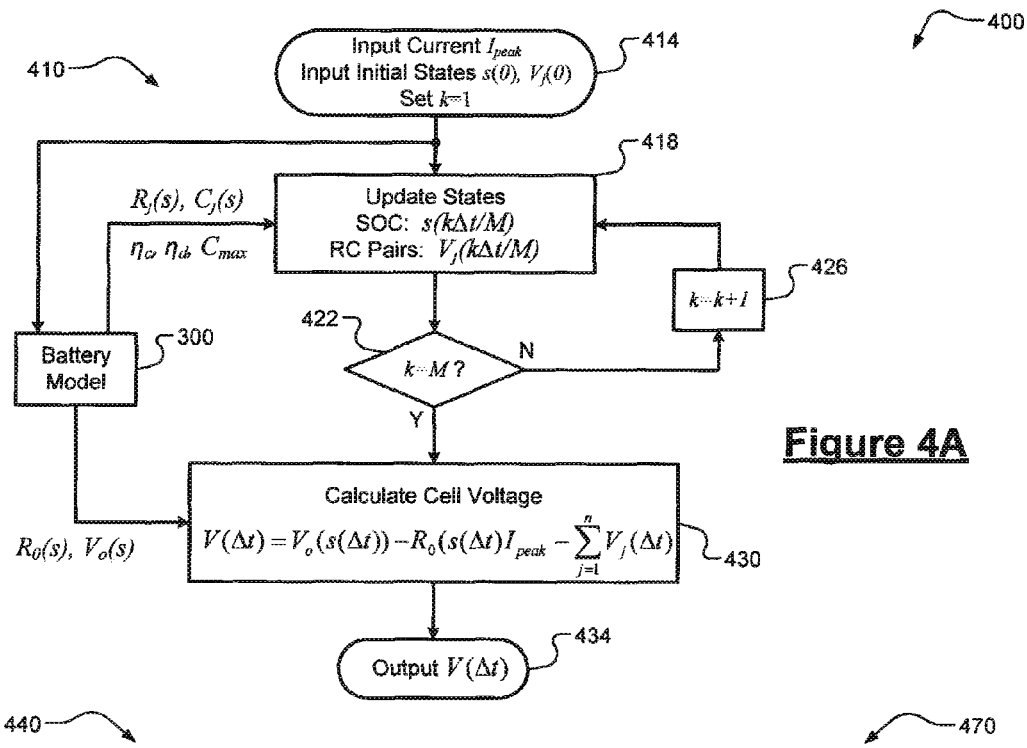
Figure 4A
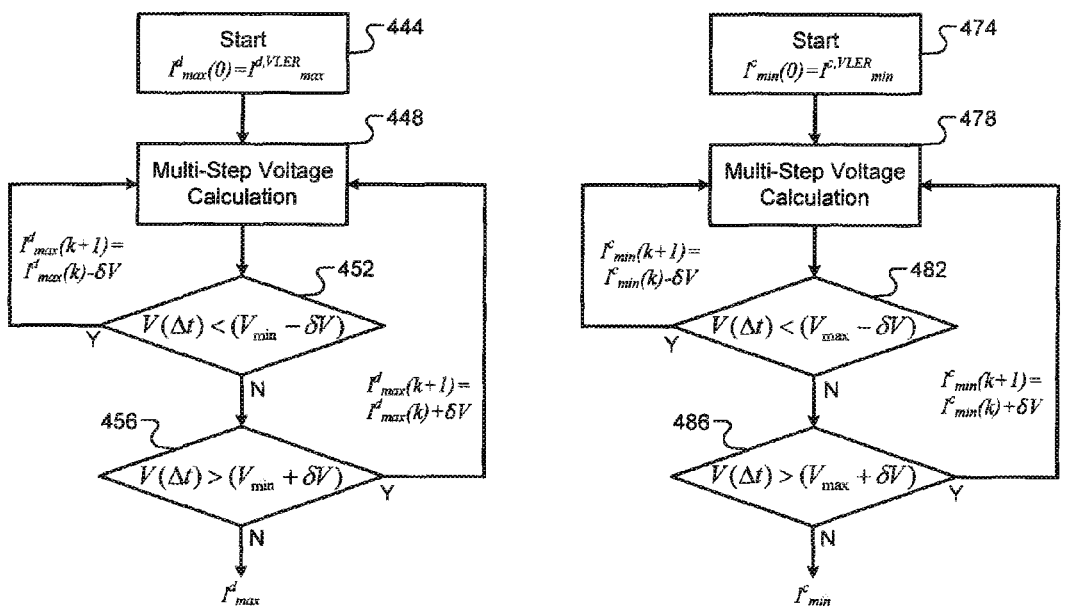
Figure 4B   Figure 4C

MULTI-STEP MODEL PREDICTIVE ITERATIVE TECHNIQUES FOR BATTERY SYSTEM PEAK POWER ESTIMATION

FIELD

The present disclosure relates generally to battery systems for electrified vehicles and, more particularly, to multi-step model predictive iterative (MMPI) techniques for battery system peak power estimation.

BACKGROUND

Battery state estimation (BSE) is a primary function of a battery management system of an electrified vehicle (EV). Two major functions of BSE are state of charge (SOC) estimation and state of power (SOP) estimation. SOC represents a current amount (e.g., a percentage) of a charge capacity that is currently being stored by the battery system. SOP represents a peak power capability of the EV. An accurate SOP estimation is important for determining maximum charging/discharging power of the battery system for an arbitrary time interval, particularly for EV applications. Conventional SOP estimation techniques (SOC limited, voltage limited ohmic resistance (VLOR) only, voltage limited first-order extrapolation of open-circuit voltage (VLEO) with resistor-capacitor (RC) dynamics, etc.) do not consider variations of all resistor and capacitor values during a constant current pulse, particularly over long time intervals. Because RC parameters are a function of SOC, the RC parameters could potentially vary greatly during the current pulse. Thus, while such battery management or BSE systems work for their intended purpose, there remains a need for improvement in the relevant art.

SUMMARY

In one aspect, a method is provided in accordance with the teachings of the present disclosure. In an exemplary implementation, the method includes receiving, at a controller of an electrified vehicle, measured current, voltage, and temperature of a battery system of the electrified vehicle. The method includes determining, at the controller, operating parameters for the battery system based on the measured current, voltage, and temperature. The method includes determining, at the controller, an initial peak current at a start of a current prediction period for the battery system based on the operating parameters. The method includes determining, at the controller, an instantaneous peak current of the battery system based on its initial peak current by performing voltage-limited extrapolation of resistances and open-circuit voltage (VLERO) of a battery model for the battery system. The method also includes controlling, by the controller, the battery system and an electric motor of the electrified vehicle based on the determined instantaneous peak current.

In one exemplary implementation, the operating parameters of the battery system include at least one of its state of charge (SOC) and its impedance. In one exemplary implementation, the battery model is an asymmetric equivalent circuit model having asymmetric parameters for charging and discharging of the battery system. In one exemplary implementation, the asymmetric equivalent circuit model includes an ohmic resistance, an open circuit voltage (OCV), and at least one resistor-capacitor (RC) pair, each RC pair corresponding to a resistance and a capacitance for either charging or discharging of the battery system.

In one exemplary implementation, the OCV is a sum of a one-state hysteresis voltage component and a voltage component dependent on the SOC of the battery system. In one exemplary implementation, the method further includes determining, at the controller, the SOC based on a ratio between remaining usable capacity and full capacity of the battery system. The method also includes determining, at the controller, a predicted voltage of the battery system after a period based on the initial peak current.

In one exemplary implementation, performing VLERO includes performing, at the controller, first-order extrapolation of all resistors of the asymmetric equivalent circuit model and extrapolation of the OCV using constant RC time constants. In one exemplary implementation, determining the predicted voltage further includes iteratively (i) incrementing the SOC and (ii) calculating voltage states for a plurality of time steps of the period.

In one exemplary implementation, the method includes determining, at the controller, whether the predicted voltage is within a voltage threshold from a critical voltage of the battery system, wherein the critical voltage is a minimum or maximum allowable voltage of the battery system. In one exemplary implementation, the method further includes determining, at the controller, the instantaneous peak current based on the predicted voltage when the predicted voltage is within the voltage threshold from the critical voltage of the battery system.

In one exemplary implementation, the method further includes determining, at the controller, the impedance of the battery system based on its temperature. In one exemplary implementation, the method further includes controlling, by the controller, the battery system to provide the instantaneous peak current to the electric motor.

In another aspect, an electrified vehicle is provided in accordance with the teachings of the present disclosure. In an exemplary implementation, the electrified vehicle includes an electric motor, a battery system configured to power the electric motor, and a controller. The controller is configured to receive measured current, voltage, and temperature of the battery system, determine operating parameters for the battery system based on the measured current, voltage, and temperature, determine an initial peak current at a start of a current prediction period for the battery system based on the operating parameters, determine an instantaneous peak current of the battery system based on its initial peak current by performing VLERO of a battery model for the battery system, and control the battery system and the electric motor based on the determined instantaneous peak current.

In one exemplary implementation the operating parameters of the battery system include at least one of its SOC and its impedance, and wherein the battery model is an asymmetric equivalent circuit model having asymmetric parameters for charging and discharging of the battery system. In one exemplary implementation, the asymmetric equivalent circuit model includes an ohmic resistance, an OCV, and at least one RC pair, each RC pair corresponding to a resistance and a capacitance for either charging or discharging of the battery system.

In one exemplary implementation the controller is further configured to determine the SOC based on a ratio between remaining usable capacity and full capacity of the battery system. In one exemplary implementation, the controller is further configured to determine a predicted voltage of the battery system after a period based on the initial peak current. In one exemplary implementation, the controller is configured to perform VLERO by performing first-order extrapolation of all resistors of the asymmetric equivalent circuit model and extrapolation of the OCV using constant RC time constants.

Further areas of applicability of the teachings of the present disclosure will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present disclosure are intended to be within the scope of the present disclosure.

BRIEF DESCRIPTION OF THE DRAWINGS

FIGS. 4A-4C are example flow diagrams for a multi-step model predictive iterative (MMPI) method for battery system peak power estimation according to the principles of the present disclosure.

DESCRIPTION

As previously mentioned, because resistor-capacitor (RC) parameters for a battery system are functions of its state of charge (SOC), the RC parameters could potentially vary significantly during a constant current pulse. Conventional peak power or state of power (SOP) estimation only depends on a model's current state, and thus these varying RC parameters could cause large errors in SOP prediction over large time intervals. These errors in SOP prediction could potentially limit an electrified vehicle (EV) from fully utilizing the maximum power capability of its battery system. Accordingly, multi-step model predictive iterative (MMPI) techniques for battery system peak power (SOP) estimation are presented. These techniques provide for more accurate prediction or estimation of instantaneous maximum possible current at a given time, thereby providing for increased battery system efficiency, increased EV responsiveness, and/or improved battery system safety.

The techniques implement a higher fidelity battery equivalent circuit model (or "ECM") incorporating one-state-hysteresis and asymmetric parameter values for use with SOC and SOP algorithm verification. The techniques include two model-based SOP algorithms to improve voltage-limit based power output accuracy in larger time intervals. A first algorithm considers first-order extrapolation of resistor values and open circuit voltage (OCV) based on the instantaneous equivalent circuit model parameters for a specific battery cell. A second algorithm (the "MMPI" method) incorporates the battery equivalent circuit model in a model predictive fashion.

Figure 1:
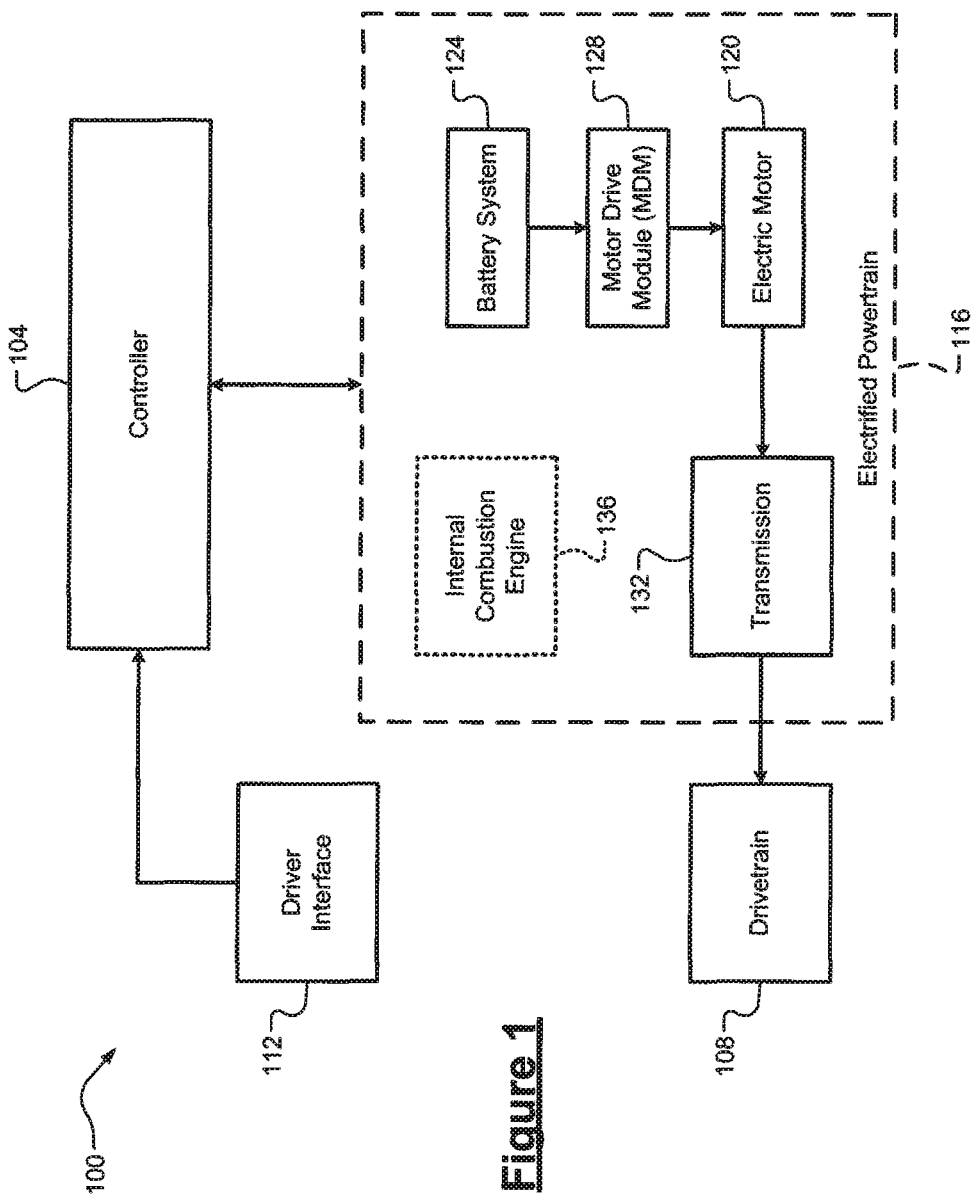
FIG. 1 is an example functional block diagram of an electrified vehicle (EV) according to the principles of the present disclosure.

Referring now to FIG. 1, a functional block diagram of an electrified vehicle (EV) 100 is illustrated. Examples of the electrified vehicle 100 include a battery electric vehicle (BEV), an extended-range electric vehicle (EREV), a fuel cell electric vehicle (FCEV), and a hybrid electric vehicle (HEV) such as a plug-in HEV (PHEV) and a non-plug-in HEV. The electrified vehicle 100 could also be another suitable electrified vehicle. The electrified vehicle 100 includes a controller 104 that controls operation of the electrified vehicle 100. For example, the controller 104 may include a single processor or a plurality of processors operating in a parallel or distributed architecture, the processor(s) configured to execute a set of instructions to perform at least a portion of the techniques of the present disclosure. Specifically, the controller 104 controls drive torque supplied to a drivetrain 108 (one or more wheels, a differential, etc.) in response to a torque request via a driver interface 112. The driver interface 112 is one or more devices configured to allow a driver of the electrified vehicle 100 to input a vehicle torque request, e.g., an accelerator pedal. The drive torque is supplied to the drivetrain 108 from an electrified powertrain 116.

The electrified powertrain 116 is a high power electrified powertrain capable of generating enough drive torque to propel the electrified vehicle 100. In one exemplary implementation, the electrified powertrain 116 for a BEV includes an electric motor 120, a battery system 124, a motor drive module (MDM) 128, and a transmission 132. The transmission 132 transfers drive torque generated by the electric motor 120 to the drivetrain 108. Examples of the electric motor 120 are synchronous electric motors and induction (asynchronous) electric motors. In some implementations (EREV, HEV, etc.), the electrified powertrain 116 could optionally include an internal combustion engine 136. The internal combustion engine 136 combusts a mixture of air and fuel, e.g., gasoline, within cylinders to rotatably drive a crankshaft and generate drive torque. In one implementation, the internal combustion engine 136 is coupled to an electrically variable transmission (EVT) 132 utilizing two electric motors 120 and is utilized to both provide motive power and recharge the battery system 124, e.g., during driving of the electrified vehicle 100.

Figure 2:
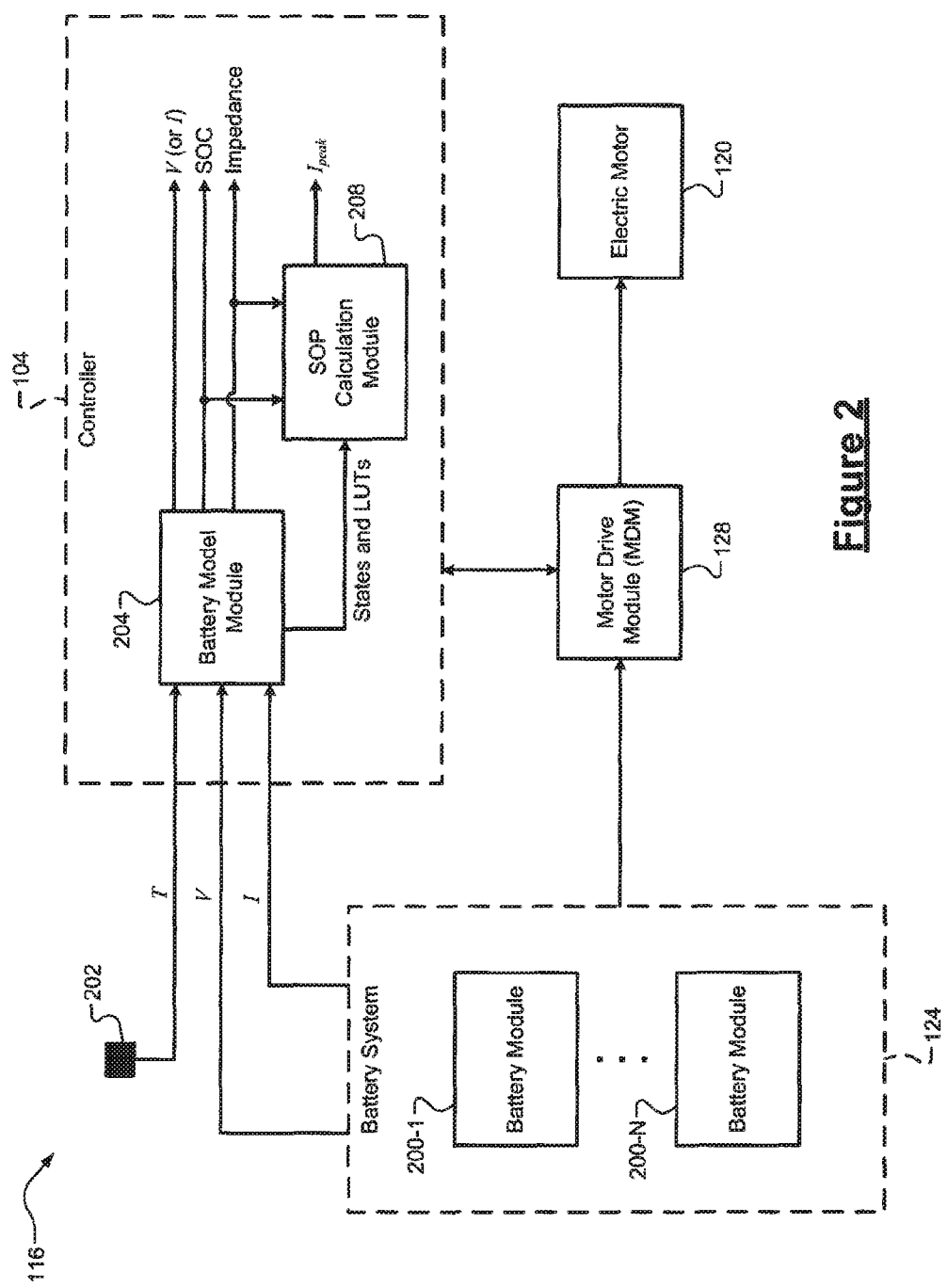
FIG. 2 is an example functional block diagram of a battery system of the EV according to the principles of the present disclosure.

Referring now to FIG. 2, an example functional block diagram of the electrified powertrain 116 is illustrated. The battery system 124 includes a plurality of battery modules 200-1 . . . 200-N (N>1; collectively "battery modules 200"). Each battery module 200 is configured to generate and output a low direct current (DC) voltage. For example, each battery module 200 could include at least one lithium ion (Li-ion) cell, each Li-ion cell having a voltage of approximately four Volts DC. The battery system 124 is configured to generate and output a DC voltage based on some combination of the battery modules 200. The MDM 128 is configured to obtain one or more alternating current (AC) voltages for the electric motor 120. For example, different phase-shifted AC voltages could be applied to different coils/windings/stators (not shown) of the electric motor 120, which could cause a rotor (not shown) of the electric motor 120 to rotate and generate drive torque. Example components of the MDM 128 include transistors, capacitors, a DC-DC converter, and an inverter. A temperature sensor 202 is configured to measure a temperature (T) associated with the battery system 124.

In one exemplary implementation, the controller 104 includes a battery model module 204 and an SOP calculation module 208. For example, the controller 104 could include one or more processors and a memory that collectively execute these modules 204, 208. This architecture for the controller 104 corresponds to the MMPI method, which is also discussed in greater detail further below with respect to FIGS. 4A-4C. The battery model module 204 defines a battery model for the battery system 124. In response to a measured current I, a measured voltage V, and/or the measured temperature T, the battery model module 204 is configured to obtain and output the voltage V (or the current I), the SOC, an impedance of the battery system 124, and specific states and/or look-up tables (LUTs) corresponding to parameters of the battery model module 204. In response to receiving the SOC, the impedance, and the states and LUTs from the battery model module 204, the SOP calculation module 208 is configured to calculate (or predict) a peak current ($I_{peak}$) of the battery system 124.

It will be appreciated that the configuration of the electrified powertrain 116 could be different than illustrated in FIG. 2. More specifically, in one exemplary implementation the battery system 124 could include a battery management system (separate from the controller 104) that is configured to perform at least a portion of the techniques of the present disclosure. For example, the battery management system could perform the SOP calculation. In this exemplary configuration, the battery management system could receive the measured parameters (e.g., current, voltage, and temperature). It will also be appreciated that other configurations of the electrified powertrain 116 could be implemented that also implement the techniques of the present disclosure.

Figure 3:
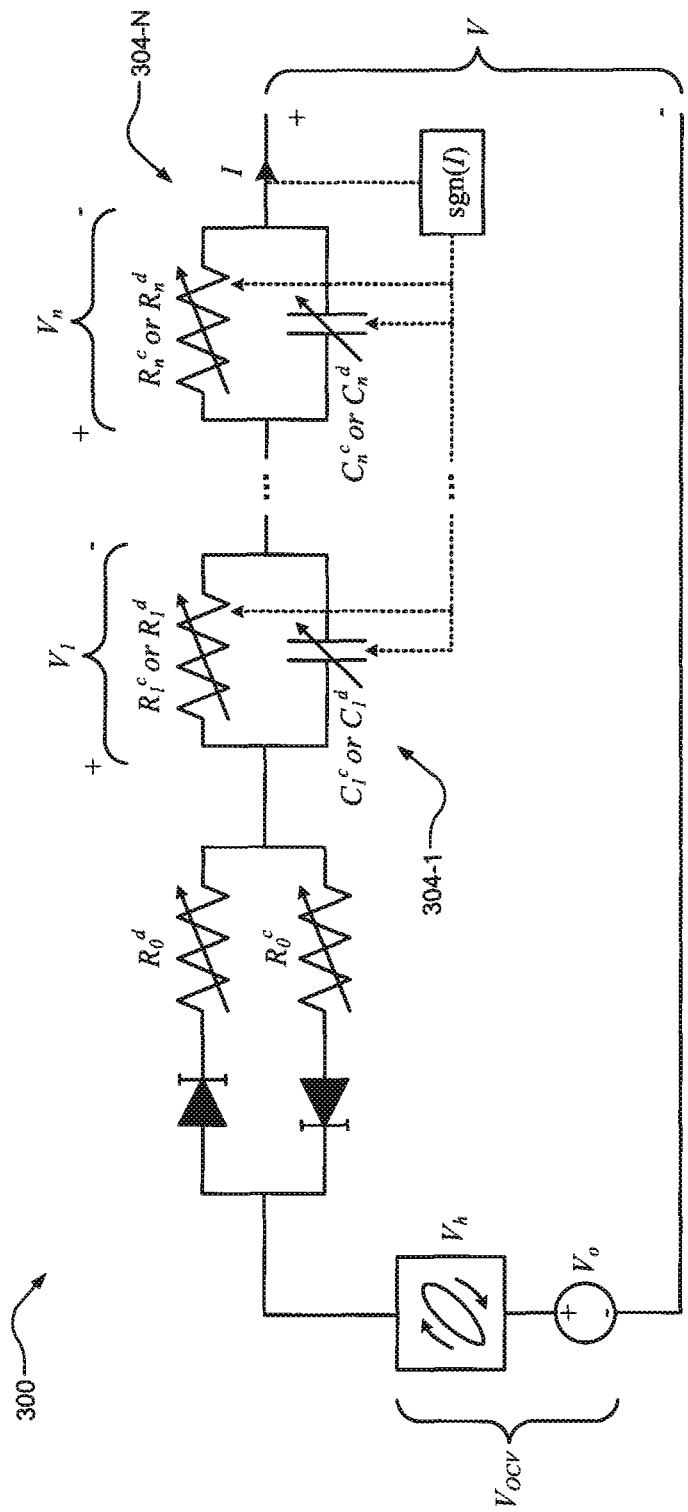
FIG. 3 is an example asymmetric equivalent circuit model according to the principles of the present disclosure.

Referring now to FIG. 3, an example asymmetric equivalent circuit model 300 is illustrated. In one exemplary implementation, the battery model module 204 utilizes the asymmetric equivalent circuit model 300 (hereinafter "model 300"). The model 300 includes an ohmic resistance, an open-circuit voltage (OCV)($V_{OCV}$), and n different RC pairs 304-1 ... 304-n (hereinafter RC pairs 304). The resistance and capacitance values for each of the RC pairs 304 are also asymmetric, and thus could potentially be different for charging versus discharging. Specifically, $R_n^c$ and $R_n^d$ represent charging and discharging resistances of the $n^{th}$ RC pair 304, and $C_n^c$ and $C_n^d$ represent charging and discharging capacitances of the $n^{th}$ RC pair 304. The ohmic resistance corresponds to n=0. These circuit parameters are functions of SOC and temperature (T). For some battery cell chemistries, hysteresis effects have a measurable effect. Thus, part of the OCV $V_{OCV}$ is able to be modeled as a hysteresis voltage ($V_h$) as follows:

$$V_{OCV} = V_o + V_h \quad (1),$$

where $V_o$ is a voltage component dependent upon the SOC.

In one exemplary implementation, the hysteresis is modeled via a zero-state hysteresis as follows:

$$V_h = V_h^{max} sgn(I) \quad (2),$$

where $V_h^{max}$ is the maximum hysteresis voltage and sgn(I) is a polarity of the current I. In one exemplary implementation, the model 300 is improved via the use of tolerance. For example only, a one-state hysteresis model could be utilized to add dynamic behavior to how the hysteresis voltage $V_h$ changes, such as in the differential form as follows:

$$dV_h/dt = \gamma I(-sgn(I)V_h + V_h^{max}) \quad (3),$$

where t is time and an additional gamma gain γ affects a slew-type rate. This one-state hysteresis could be modeled using a controlled voltage source and an integrator. Additionally, the hysteresis parameters could be modeled as non-linear functions of temperature T, the OCV $V_{OCV}$ could be modeled as a non-linear function of SOC and temperature T, and capacity could be modeled as a function of temperature T. In the event the current goes to zero (or approximately zero, within a tolerance), the model 300 is designed to remember its old value, such as through the use of a relay block.

Columbic losses could be modeled as charging/discharging inefficiencies, which contribute to the difference between the amount of energy put into a cell and the energy extracted. Therefore, the internal SOC state is updated to include this effect of charging/discharging inefficiencies, such as follows:

$$SOC(t) = \frac{-1}{C_{max}} \int [\eta_c i^-(t) + \eta_d^{-1} i^+(t)] dt, \quad (4)$$

$$i^-(t) = \min(i(t), 0), \text{ and } i^+(t) = \max(i(t), 0),$$

where $0 \leq \eta_c \leq 1$ and $0 \leq \eta_d \leq 1$ are the charging and discharging inefficiencies. The definition of cell capacity could potentially impact the meaning of the efficiency parameters. For example, let $Ah_c$ represent capacity (charging) from current integration from 0% to 100% SOC (in amp-hours, or Ah) and let $Ah_d$ represent capacity (discharging) from current integration from 100% to 0% SOC. Inefficiencies result in $Ah_d < Ah_c$, the ratio being learned from experimental data.

If $Ah_c$ is defined as the capacity, charging efficiency $\eta_c$ is one. Thus, only discharging losses are modeled and discharging efficiency $\eta_d$ is defined as follows:

$$\eta_d = Ah_d/Ah_c \quad (5).$$

Similarly, if $Ah_d$ is defined as the capacity, the inefficiencies could be expressed as follows:

$$\eta_d = Ah_d/Ah_c; \eta = 1 \quad (6).$$

Assuming symmetric losses, charging efficiency and discharging efficiency could be redefined as follows:

$$\eta_c = \eta_d = \sqrt{Ah_d/Ah_c} \quad (7).$$

Based on Equation 7 above, the following definition for capacity ($C_{max}$) is obtained:

$$C_{max} = Ah_d/Ah_c \quad (8).$$

In one exemplary implementation, the parameters for the model 300 are summarized in Table 1 below:

| Parameter | Dependence | Description |
| --- | --- | --- |
| $C_j^c$ | f(T,SOC) | Charging Capacitance, j = 1 ... n |
| $C_j^d$ | f(T,SOC) | Discharging Capacitance, j = 1 ... n |
| $R_i^c$ | f(T,SOC) | Charging Resistance, i = 0 ... n |
| $R_i^d$ | f(T,SOC) | Discharging Resistance, i = 0 ... n |
| γ | f(T) | hysteresis rate of change gain |
| $V_h^{max}$ | f(T) | Max hysteresis magnitude |
| $C_{max}$ | f(T) | Capacity |
| $\eta_c$ | none | Charging inefficiency ∈ [0, 1] |
| $\eta_d$ | none | Discharging inefficiency ∈ [0, 1] |
| $V_o$ | f(T,SOC) | Part of OCV |

In one exemplary implementation, the model 300 is parameterized using high pulse power characterization (HPPC) tests and OCV-SOC charge/discharge tests. This type of data could come in the form of voltage and current profiles over time, e.g., over the full SOC range and at multiple points of temperature T. Optimization-based fitting methods could be used to extract the parameters. In one exemplary implementation, the following equation is used for OCV-SOC curve fitting:

$$V_{oi} = k_0 - k_1/s_i + k_2 s_i + k_3 \log s_i - k_4 \log(1-s_i) + k_5 s_i^2 + k_6 s_i^3 + k_7 s_i^4 + k_8 s_i^5 = s_i^T k \quad (9),$$

where $V_{oi}$ is the $i^{th}$ voltage data point and $s_i$ is the SOC and is a number between zero and one. The use of the higher order terms provides extra fidelity in the model 300. To ensure a non-decreasing fitted curve with these extra terms, the following derivative constraints could be used:

$$\frac{dV_{o_i}}{ds_i} = k_1/s_i^2 + k_2 + k_3/s_i + k_4/(1-s_i) + \quad (10)$$

$$2k_5 s_i + 3k_6 s_i^2 + 4k_7 s_i^3 + 5k_8 s_i^4 = d_i^T k \geq 0.$$

In one exemplary implementation, the fitting is formulated as the following quadratic optimization problem:

$$\min_k (Sk-v)^T(Sk-v) \text{ subject to } Dk \geq 0 \quad (11)$$

$$S^T = [s_1 \ s_2 \ \ldots \ s_n], \ D^T = [d_1 \ d_2 \ \ldots \ d_n], \ v^T = [V_{o_1} \ V_{o_2} \ \ldots \ V_{o_n}].$$

HPPC data over the full SOC range is used in an optimization-based fitting routine to obtain resistor and capacitor values. The voltage values are pre-processed to remove the effect of OCV. Since there is a large rest time prior to the pulse, it is assumed that the initial voltage states of the RC elements are zero. For a current pulse of $I_{pulse}$ amps and duration $t_{purse}$ that starts at time t=0, the ideal OCV subtracted voltage response ($V_{OS}(t)$) could be derived as follows:

$$V_{OS}(t) = \begin{cases} -\left(R_0 + \sum_{j=1}^{n} R_j\left(1 - e^{\frac{-t}{\tau_j}}\right)\right) i_{pulse} & t < t_{pulse} \\ -\sum_{j=1}^{n} R_j\left(1 - e^{\frac{-t_{pulse}}{\tau_j}}\right) i_{pulse} e^{\frac{-(t-t_{pulse})}{\tau_j}} & t \geq t_{pulse} \end{cases}, \quad (12)$$

where $R_i$, i=0 ... n and $\tau_j = R_j C_j$, j=1 ... n are parameters representing resistances and time constants, respectively. They are assumed to be constant over the pulse interval. Given voltage/current data ($V_{OS_k}^{Data}$), and using Equation 12, the following optimization could be formulated for parameter fitting:

$$\min_{r,\tau} \sum_k \left(V_{OS_k}^{Data} - V_{OS}(r, \tau, t_k)\right)^2 \quad (13)$$

$$r = [R_0 \ R_1 \ \ldots \ R_n]^T, \ \tau = [\tau_1 \ \ldots \ \tau_n].$$

In one exemplary implementation, curve fitting of charging and discharging pulses is performed to solve the above optimization problem. For example, choosing time constants rather than capacitances as optimization variables could provide more stable fitting results.

SOP is then estimated by utilizing the model 300. In one exemplary implementation, a voltage limit RC method with extrapolation of resistance values and OCV (VLERO) is presented. This method incorporates first-order extrapolation of multiple parameters of the model 300. In another exemplary implementation, an MMPI method is applied. This method updates the parameters of the model in much smaller time intervals where constant or linear variations of the parameters are considered. In yet another implementation, an SOP verification method is utilized, which incorporated drive cycle data to realistically excite the model 300.

The VLERO method considers RC elements, first-order extrapolation of all resistors, extrapolation of OCV, and constant RC time constants. In one exemplary implementation, a Taylor series expansion of variation of resistances is expressed as follows:

$$R_j(s(t+\Delta t)) = R_j\left(s(t) - i_{peak}\varsigma\frac{\Delta t}{C_{max}}\right), \ j \in [0, n] \quad (14)$$

$$= R_j(s(t)) - i_{peak}\varsigma\frac{\Delta t}{C_{max}}\frac{\partial R_j}{\partial s} + \text{high order components,}$$

where $\varsigma$ is the coulomb efficiency factor, which is equal to $\eta_c$ when charging and $1/\eta_d$ when discharging. Using the above with higher order components neglected, the voltage response of RC elements is expressed as follows:

$$V_j(t+\Delta t) = \exp(-\Delta t/\tau_j)V_j(t) + \quad (15)$$

$$\int_t^{t+\Delta t} \exp(-(\Delta t - T)/\tau_j)\frac{R_j(T)}{\tau_j} dT \cdot i_{peak}, \ j \in [1, n]$$

$$= \exp(-\Delta t/\tau_j)V_j(t) + R_j(s(t))(1 - \exp(-\Delta t/\tau_j))i_{peak} +$$

$$\varsigma\frac{\tau_j}{C_{max}}\frac{\partial R_j}{\partial s}\left(1 - \exp(-\Delta t/\tau_j) - \frac{\Delta t}{\tau_j}\right)i_{peak}^2$$

where $$R_j(T) = R_j(s(t)) - i_{peak}\varsigma\frac{T}{C_{max}}\frac{\partial R_j(s)}{\partial s}\bigg|_{s=s(t)}.$$

Using Equations 14 and 15, the cell voltage response (V(t)) could be modified as follows:

$$V(t+\Delta t) = V_o(s(t+\Delta t)) - R_0(s(t+\Delta t))i_{peak} - \sum_{j=1}^n V_j(t+\Delta t) \approx \quad (16)$$

$$V_o(s(t)) - i_{peak}\varsigma\frac{\Delta t}{C_{max}}\frac{\partial V_o}{\partial s} - \left(R_0(s(t)) - i_{peak}\varsigma\frac{\Delta t}{C_{max}}\frac{\partial R_o}{\partial s}\right)i_{peak} -$$

$$\sum_{j=1}^n \exp(-\Delta t/\tau_j)V_j(t) + R_j(s(t))(1 - \exp(-\Delta t/\tau_j))i_{peak} +$$

$$\varsigma\frac{\tau_j}{C_{max}}\frac{\partial R_j}{\partial s}\left(1 - \exp(-\Delta t/\tau_j) - \frac{\Delta t}{\tau_j}\right)i_p^2.$$

The above is rearranged into a quadratic equation of the form:

$$ai_{peak}^2 + bi_{peak} + c = 0 \quad (17)$$

$$a = \varsigma\frac{\Delta t}{C_{max}}\frac{\partial R_o}{\partial s} - \sum_{j=1}^n \frac{\partial R_j}{\partial s}\frac{\tau_j}{C_{max}}\left(1 - \exp(-\Delta t/\tau_j) - \frac{\Delta t}{\tau_j}\right)$$

$$b = -\varsigma\frac{\Delta t}{C_{max}}\frac{\partial V_o}{\partial s} - R_o - \sum_{j=1}^n R_j(1 - \exp(-\Delta t/\tau_j))$$

$$c = V_o - V - \sum_{j=1}^n \exp(-\Delta t/\tau_j)V_j.$$

To obtain peak charging current $i_{min}^c$, charging parameter values and $V=V_{min}$ are used with Equation 17, where $V_{min}$ is a minimum allowable battery voltage. To obtain peak discharging current $i_{max}^d$, discharging parameter values and $V=V_{max}$ are used with Equation 17, where $V_{max}$ is a maximum allowable battery voltage. The quadratic root formula is applied in both cases to obtain closed form solutions. To avoid complex roots related to non-realistic extrapolation scenarios, a correction of the resistance derivatives is applied prior to using the quadratic root formula. Without such a correction, for example, this correction could lead to extrapolation to negative resistance values.

Referring again to FIG. 2, for power limit (SOP) prediction over large time intervals, however, the VLERO method discussed above could potentially poorly approximate the variations in OCV and the parameters of the model 300. The MMPI method, on the other hand, is configured to better capture the variation of resistor/capacitor values over a limited time horizon. This approach incorporates the battery model 300 (or the battery model module 204) in the form of parameter LUTs or functions that depend on SOC. In one exemplary implementation, the MMPI method works in two stages. An inner stage accepts a peak current input, then increments SOC using Equation 12 and calculates RC voltage states based on time-steps of length $\Delta t/M$, where M is the number of time-step divisions. This inner-stage performs M iterations to calculate end of horizon RC voltage states $V_j$, then uses them with end-of-horizon SOC to output end-of-horizon cell voltage. Model parameters in the LUTs are used in this stage.

Referring now to FIGS. 4A-4C, example flow diagrams for the MMPI method (hereinafter referred to as "MMPI method 400") for battery system peak power (SOP) estimation are illustrated. The MMPI method 400 is divided into the inner stage 410 (FIG. 4A) and two outer stages 440 (FIG. 4B) and 470 (FIG. 4C). To start the inner stage 410, the controller 104 inputs the peak current $I_{peak}$ and the initial SOC and RC pair states $s(0)$, $V_j(0)$, and sets an index k to 1 at 414. At 418, the controller 104 updates the SOC and RC pair states based on battery model parameters $(R_j(s), C_j(s), \eta_c, \eta_d, C_{max})$ to obtain updates SOC and RC pair states $s(k\Delta t/M)$, $V_j(k\Delta t/M)$. At 422, the controller 104 determines whether k equals M. If false, the controller 104 increments k by 1 at 426 and returns to 418. If true, however, the controller 104 calculates the cell voltage $V(\Delta t)$ based on battery model parameters $R_0(s), V_o(s)$ at 430. Specifically, the controller 104 could calculate the cell voltage $V(\Delta t)$ as shown below:

$$V(\Delta t) = V_o(s(\Delta t)) - R_0(s(\Delta t))I_{peak} - \sum_{j=1}^{n} V_j(\Delta t). \quad (18)$$

The controller 104 then outputs the cell voltage $V(\Delta t)$ at 434 and ends the inner stage 410.

Two methods could be employed to update the RC voltage states at each step of the inner stage 410. One method is to assume the parameters are constant during the time interval of the step, which is essentially a zero-order hold-type approach. RC voltages would be updated with parameter values corresponding to SOC at the beginning of each time step in the inner stage 410. For a small time step, this method could work well; however, using many small time steps creates a large computational cost. Thus, an alternative approach is to linearly interpolate parameters during the time step with endpoints corresponding to different known values of SOC.

A hybrid approach could also be possible that assumes non-varying RC time constants and first-order variations of resistor values. A notable difference is that the derivative used would be calculated by using the SOC values at the endpoints of the time step intervals. In yet another more general approach, resistor and RC time constant values could be independently varied. By ignoring higher-order components in the Taylor series, the following expression is obtained, which could be used in the RC voltage updates of the inner stage 410:

$$V_j(t + \Delta t) = V_j(t)\frac{1}{\xi\left(\frac{\Delta t}{\tau_j(s(t))}, \delta_{\tau_j}\right)} + i_{peak}R_j(s(t))\left(1 - \frac{1}{\xi\left(\frac{\Delta t}{\tau_j(s(t))}, \delta_{\tau_j}\right)}\right) +$$

$$i_{peak}\delta_{R_j}\tau_j(s(t))\frac{\frac{\Delta t}{\tau_j(s(t))} - 1 + \frac{1}{\xi\left(\frac{\Delta t}{\tau_j(s(t))}, \delta_{\tau_j}\right)}}{1 + \delta_{\tau_j}}$$

where $$\xi\left(\frac{\Delta t}{\tau_j}, \delta_{\tau_j}\right) = \left(1 + \delta_{\tau_j}\frac{\Delta t}{\tau_j}\right)^{\frac{1}{\delta_{\tau_j}}}$$

$$\delta_{R_j} = -\varsigma\frac{i_{peak}}{C_{max}}, \frac{dR_j}{ds}$$

$$\delta_{\tau_j} = -\varsigma\frac{i_{peak}}{C_{max}}, \frac{d\tau_j}{ds}.$$

FIGS. 4B and 4C illustrate outer stages 440 and 470 corresponding to calculating maximum discharge current ($I^d_{max}$) and minimum charging current ($I^c_{min}$), respectively. These outer stages 440, 470 effectively perform root-finding tasks to determine peak current that matches voltage limits of $V_{min}$ or $V_{max}$. Example root-finding algorithms include a bisection method and a secant method. A simple approach is to iteratively increase/decrease peak current until it is within a tolerance ($\delta V$) to the voltage limit. The VLERO method discussed herein is utilized to obtain an initial peak current value. If the corresponding terminal voltage obtained by the inner stage 410 is within the tolerance $\delta V$ of the voltage limit ($V_{max}$ for charging, $V_{min}$ for discharging), the iteration ends. If the terminal voltage is not close enough, the estimated current values are either increased or decreased in steps of $\delta i$ until the voltage is within the tolerance $\delta V$.

Referring now to FIG. 4B, the first outer stage 440 starts at 444 with the controller 104 setting the initial maximum discharge current $I^d_{max}(0)$ to a maximum discharge current $I^{d,VLERO}_{max}$ obtained using the VLERO method discussed herein. At 448, the controller 104 performs the multi-step voltage calculation. At 452 and 456, the controller 104 determines whether the cell voltage $V(\Delta t)$ is within the tolerance $\delta V$ of the voltage limit $V_{min}$. If the cell voltage $V(\Delta t)$ is not within the tolerance $\delta V$ of the voltage limit $V_{min}$, the controller 104 adjusts the maximum discharge current up or down by a step of $\delta V$ and recalculates the cell voltage $V(\Delta t)$ at 448. Otherwise, the controller 104 obtains the maximum discharge current $I^d_{max}$ 460 and the MMPI method 400 ends.

Referring now to FIG. 4C, the second outer stage 470 starts at 474 with the controller 104 setting the initial minimum charge current $I^c_{max}(0)$ to a minimum charge current $I^{c,VLERO}_{max}$ obtained using the VLERO method discussed herein. At 478, the controller 104 performs the multi-step voltage calculation. At 482 and 486, the controller 104 determines whether the cell voltage $V(\Delta t)$ is within the tolerance $\delta V$ of the voltage limit $V_{max}$. If the cell voltage $V(\Delta t)$ is not within the tolerance $\delta V$ of the voltage limit $V_{max}$, the controller 104 adjusts the minimum charge current up or down by a step of $\delta V$ and recalculates the cell voltage $V(\Delta t)$ at 448. Otherwise, the controller 104 obtains the minimum discharge current $I^c_{min}$ at 490 and the MMPI method 400 ends.

It should be understood that the mixing and matching of features, elements, methodologies and/or functions between various examples could be expressly contemplated herein so that one skilled in the art would appreciate from the present teachings that features, elements and/or functions of one example could be incorporated into another example as appropriate, unless described otherwise above.

What is claimed is:

1. A method comprising:
receiving, at a controller of an electrified vehicle, measured current, voltage, and temperature of a battery system of the electrified vehicle;
determining, at the controller, operating parameters for the battery system based on the measured current, voltage, and temperature, wherein the operating parameters for the battery system include its state of charge (SOC);
determining, at the controller, an initial peak current at a start of a current prediction period for the battery system based on the operating parameters;
determining, at the controller, an instantaneous peak current of the battery system based on its initial peak current by performing voltage-limited extrapolation of resistances and open-circuit voltage (VLERO) of a battery model for the battery system; and
controlling, by the controller, the battery system and an electric motor of the electrified vehicle based on the determined instantaneous peak current,
wherein the battery model is an asymmetric equivalent circuit model having asymmetric parameters for charging and discharging of the battery system,
wherein the asymmetric equivalent circuit model includes an ohmic resistance, an open circuit voltage (OCV), and at least one resistor-capacitor (RC) pair, each RC pair corresponding to a resistance and a capacitance for either charging or discharging of the battery system,
and wherein performing VLERO further includes performing first-order extrapolation of all resistors of the asymmetric equivalent circuit model and extrapolation of the OCV using constant RC time constants.

2. The method of claim 1, wherein the operating parameters of the battery system further include at least one of its state of charge (SOC) and its impedance.

3. The method of claim 1, wherein the OCV is a sum of a one-state hysteresis voltage component and a voltage component dependent on the SOC of the battery system.

4. The method of claim 3, further comprising determining, at the controller, the SOC based on a ratio between remaining usable capacity and full capacity of the battery system.

5. The method of claim 4, further comprising determining, at the controller, a predicted voltage of the battery system after a period based on the initial peak current.

6. The method of claim 5, wherein determining the predicted voltage further includes iteratively (i) incrementing the SOC and (ii) calculating voltage states for a plurality of time steps of the period.

7. The method of claim 6, further comprising determining, at the controller, whether the predicted voltage is within a voltage threshold from a critical voltage of the battery system, wherein the critical voltage is a minimum or maximum allowable voltage of the battery system.

8. The method of claim 7, further comprising determining, at the controller, the instantaneous peak current based on the predicted voltage when the predicted voltage is within the voltage threshold from the critical voltage of the battery system.

9. The method of claim 2, further comprising determining, at the controller, the impedance of the battery system based on its temperature.

10. The method of claim 1, further comprising controlling, by the controller, the battery system to provide the instantaneous peak current to the electric motor.

11. An electrified vehicle, comprising:
an electric motor;
a battery system configured to power the electric motor; and
a controller configured to:
receive measured current, voltage, and temperature of the battery system,
determine operating parameters for the battery system based on the measured current, voltage, and temperature, wherein the operating parameters for the battery system include its state of charge (SOC),
determine an initial peak current at a start of a current prediction period for the battery system based on the operating parameters,
determine an instantaneous peak current of the battery system based on its initial peak current by performing voltage-limited extrapolation of resistances and open-circuit voltage (VLERO) of a battery model for the battery system, and
control the battery system and the electric motor based on the determined instantaneous peak current,
wherein the battery model is an asymmetric equivalent circuit model having asymmetric parameters for charging and discharging of the battery system,
wherein the asymmetric equivalent circuit model includes an ohmic resistance, an open circuit voltage (OCV), and at least one resistor-capacitor (RC) pair, each RC pair corresponding to a resistance and a capacitance for either charging or discharging of the battery system,
and wherein the controller is configured to perform VLERO by performing first-order extrapolation of all resistors of the asymmetric equivalent circuit model and extrapolation of the OCV using constant RC time constants.

12. The electrified vehicle of claim 11, wherein the operating parameters of the battery system further include its impedance.

13. The electrified vehicle of claim 11, wherein the controller is further configured to determine the SOC based on a ratio between remaining usable capacity and full capacity of the battery system.

14. The electrified vehicle of claim 13, wherein the controller is further configured to determine a predicted voltage of the battery system after a period based on the initial peak current.

15. The electrified vehicle of claim 11, wherein the controller is configured to determine the instantaneous peak current of the battery system using a multi-step model predictive iterative (MMPI) method.

* * * * *